United States Patent
Andideh et al.

(10) Patent No.: US 6,890,813 B2
(45) Date of Patent: May 10, 2005

(54) POLYMER FILM METALIZATION

(75) Inventors: Ebrahim Andideh, Portland, OR (US); Daniel C. Diana, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/337,960

(22) Filed: Jan. 6, 2003

(65) Prior Publication Data

US 2004/0132285 A1 Jul. 8, 2004

(51) Int. Cl.$^7$ .................... H01L 21/00; H01L 21/8242
(52) U.S. Cl. ............................ 438/240; 438/3
(58) Field of Search ...................... 438/3, 240, 238, 438/239, 386, 399; 257/310, 295, 296

(56) References Cited

U.S. PATENT DOCUMENTS

| | | | |
|---|---|---|---|
| 5,877,072 A | 3/1999 | Andideh et al. | |
| 5,953,635 A | 9/1999 | Andideh | |
| 6,121,100 A | 9/2000 | Andideh et al. | |
| 6,178,034 B1 * | 1/2001 | Allemand et al. | 359/265 |
| 6,191,050 B1 | 2/2001 | Andideh | |
| 6,235,568 B1 | 5/2001 | Murthy et al. | |
| 6,316,063 B1 | 11/2001 | Andideh et al. | |
| 6,350,670 B1 | 2/2002 | Andideh et al. | |
| 6,362,091 B1 | 3/2002 | Andideh et al. | |
| 6,380,010 B2 | 4/2002 | Brigham et al. | |
| 6,437,444 B2 | 8/2002 | Andideh | |
| 6,448,185 B1 | 9/2002 | Andideh et al. | |
| 6,482,754 B1 | 11/2002 | Andideh et al. | |
| 6,506,692 B2 | 1/2003 | Andideh | |
| 6,596,646 B2 | 7/2003 | Andideh et al. | |
| 6,620,657 B2 * | 9/2003 | Breen et al. | 438/151 |
| 6,624,032 B2 | 9/2003 | Alavi et al. | |
| 6,630,390 B2 | 10/2003 | Andideh et al. | |
| 6,734,478 B2 * | 5/2004 | Johansson et al. | 257/295 |
| 2003/0064607 A1 * | 4/2003 | Leu et al. | 438/780 |

* cited by examiner

Primary Examiner—Matthew Smith
Assistant Examiner—Chuong Anh Luu
(74) Attorney, Agent, or Firm—Schwabe, Williamson & Wyatt, P.C.

(57) ABSTRACT

Embodiments in accordance with the present invention eliminate the need for a subtractive metal patterning process to pattern the electrode above a ferroelectric polymer. Instead, a selective electroless deposition process is used. A conductive polymer is used as a seed layer for the electroless plating of the metal electrode. A cost saving is provided by eliminating the chemical costs associated with conventional resist removal processing. The methods also potentially eliminate the requirement for aggressive and environmentally unsafe chemical-based photoresist removal processes.

10 Claims, 5 Drawing Sheets

POLYMER FILM METALIZATION

FIELD OF THE INVENTION

The present invention relates to semiconductor processing, and, more particularly, to lithographic techniques for metal patterning on a ferroelectric polymer layer.

BACKGROUND OF INVENTION

Semiconductor manufacture utilizes well known processes wherein multiple layers of various material, including semiconductor, insulator, and conductor layers, are selectively deposited and selectively removed using various deposition and material removing processes. One of those processes is used to create conductive traces to interconnect devices on the substrate. A plurality of electrically conductive traces is formed by photolithographic techniques.

One exemplary photolithographic technique involves forming a conformal layer of electrically conductive material over the dielectric layer and applying a photoresist layer over the electrically conductive material layer. The photoresist layer is photoactive, such that when exposed to light (usually ultraviolet light), the photoresist becomes insoluble (negative photoresist) in specific solvents. Light is projected through a template that shields specific areas of the photoresist while exposing other areas, thereby translating the pattern of the template onto the photoresist. After exposure, an appropriate solvent removes the desired portions of the photoresist. The remaining photoresist becomes a mask that remains on the electrically conductive material layer. The mask is used to expose areas of the electrically conductive material layer to be etched away while protecting the electrically conductive material that ultimately forms the electrically conductive traces.

A similar process is currently being used to provide conductive traces on a layer of ferroelectric polymer overlying a first conductive layer. FIG. 1 is a side view of a substrate 1 undergoing the process of adding conductive layer 20 to a conductive polymer layer 18, which itself is on the ferroelectric polymer layer 16. The substrate 1 comprises a basic lay-up of silicon 10, silicon dioxide 12, a first conductive layer 14, and a ferroelectric polymer layer 16. The substrate 1 has undergone application of a conductive polymer layer 18 and a conductive layer 20, upon which is a photoresist 22, wherein lithographic patterning, photoresist development, and plasma etching of the unwanted portions of the conductive layer 20 and conductive polymer layer 18. Plasma etching is a desirable means for removal of the conductive layer 20 and conductive layer 18 as it permits high resolution of the features.

FIG. 2 is a side view of the substrate 1 after removal of the photoresist 22. Removal of the photoresist 22 from the desired portions of the conductive layer 20 is done using a chemical removal process. Photoresist 22 exposed to plasma etching becomes hardened and difficult to remove. Strong chemicals are used in a process of dissolving away the photoresist 22 to expose the conductive layer 20. During the removal process, the chemicals also attack the desired conductive layer 20. This process leads to a high product defect rate. Further, the process is costly, and exposes the environment to a hazardous material that must be handled and disposed of properly.

Improved methods are needed to remove photoresist material that has been exposed to a plasma etching process. The methods must have a low defect rate, not harm the underlying desired material layers, be reasonably economical, and not present a hazard to personnel and the environment.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments in accordance with the present invention provide methods for removing resist material from conductive materials on a ferroelectric polymer layer. The methods do not incorporate a subtractive metal patterning process, eliminating the use of chemicals that can damage the underlying conductive layers.

Figure 1:
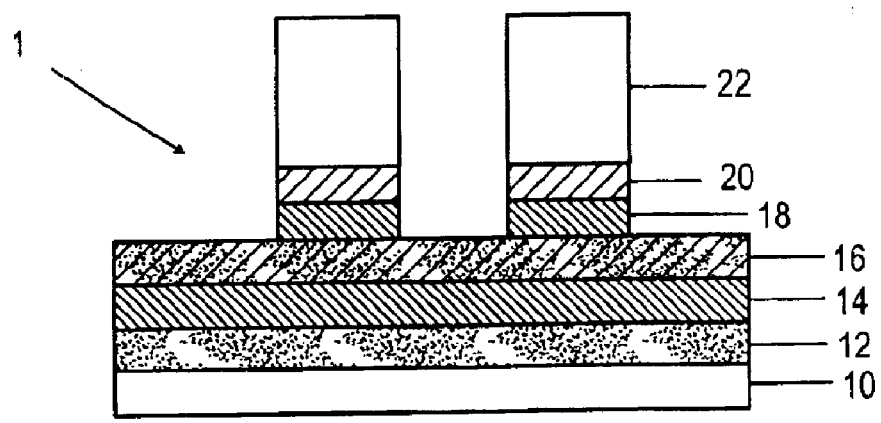
FIG. 1 is a side view of a substrate undergoing a conventional process of adding conductive traces to a substrate with a ferroelectric polymer layer and a conductive polymer layer.
Figure 2:
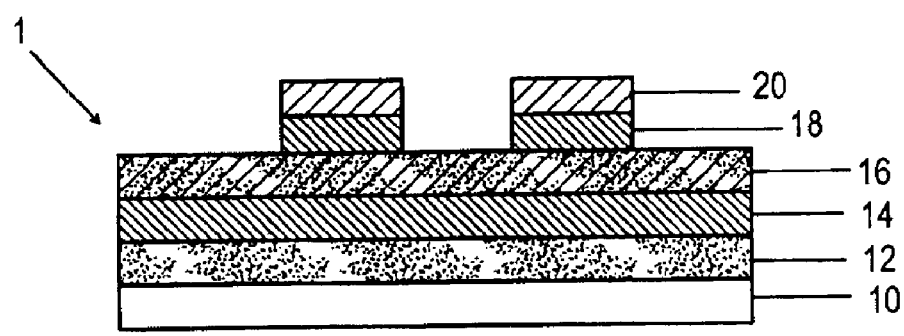
FIG. 2 is a side view of the substrate undergoing conventional chemical removal of the photoresist material.
Figure 3:
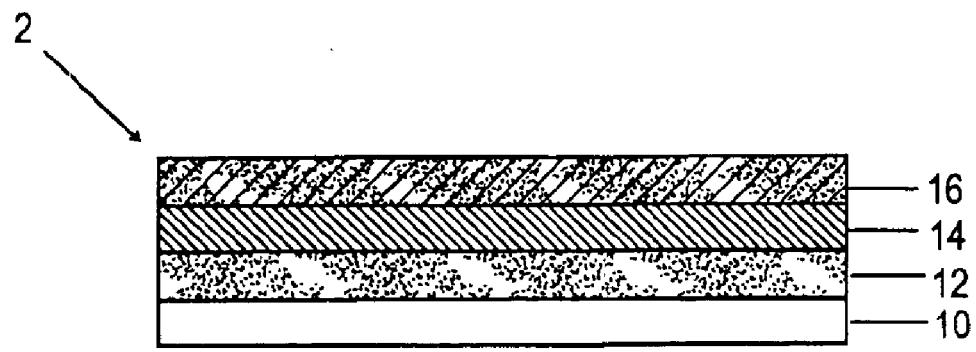
FIG. 3 is a side view of a substrate comprising a ferroelectric polymer layer in accordance with an embodiment of the present invention.

FIG. 3 is a side view of a substrate 2 undergoing the process of adding a conductive layer 20 on a conductive polymer layer 18 to a ferroelectric polymer layer 16, in accordance with an embodiment of the present invention. The substrate 2 comprises a ferroelectric polymer layer 16 covering a first conductive layer 14. The conductive layer 14 refers to the materials used in the art, also known as a metallization layer. Aluminum is the predominant conductive material used for the conductor layer to form interconnections between semiconductor devices. Other metals can be used as well as non-metal conductive materials.

Figure 4:
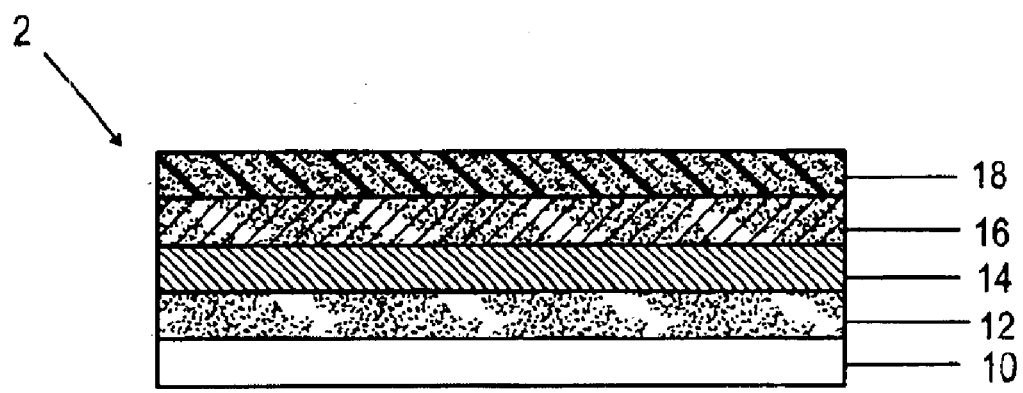
FIG. 4 is a side view of the substrate of FIG. 3 with a conductive polymer layer covering the ferroelectric polymer layer.

FIG. 4 is a side view of the substrate 2 of FIG. 3 with a conductive polymer layer 18 covering the ferroelectric polymer layer 18. The conductive polymer layer 18 is deposited onto the substrate 2 using a spin deposition and cure process.

Figure 5:
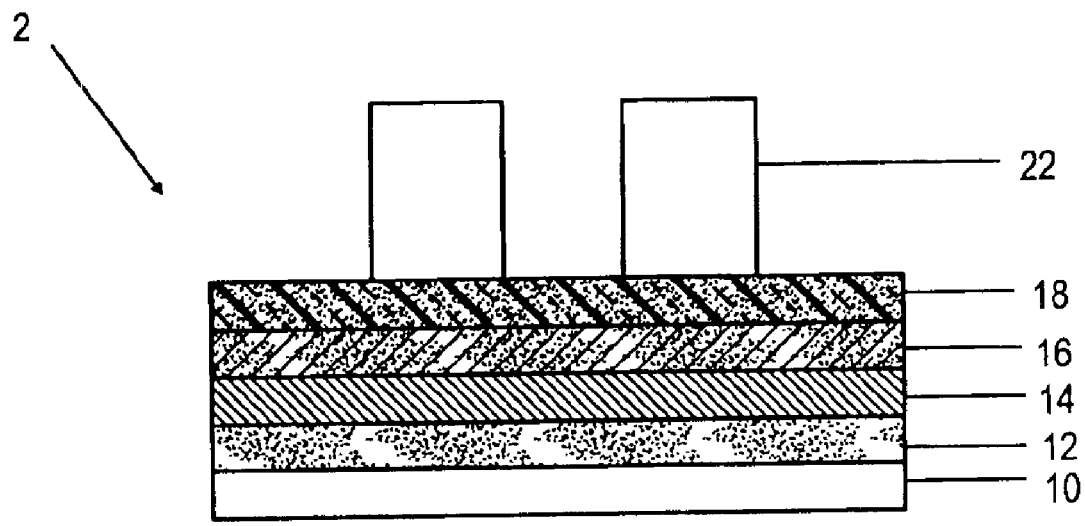
FIG. 5 is a side view of the substrate of FIG. 4 with photoresist material covering selected portions of the conductive polymer layer.

FIG. 5 is a side view of the substrate 2 of FIG. 4 provided with photoresist 22 covering selected portions of the conductive polymer 18. A photoresist mask is formed in a process including photoresist spin deposition, lithographic patterning and resist developing, followed by removal of the undeveloped photoresist.

Figure 6:
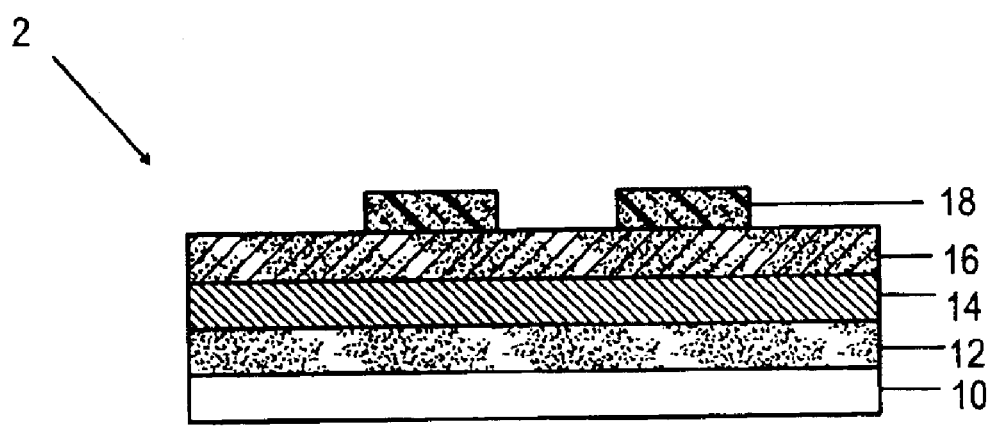
FIG. 6 is a side view of the substrate of FIG. 5 after having undergone a plasma etching process to remove the exposed conductive polymer followed by photoresist removal from the now patterned conductive polymer layer.

FIG. 6 is a side view of the substrate 2 of FIG. 5 after having undergone a plasma etching process to remove the exposed conductive polymer layer 18 followed by photoresist 22 removal from the now patterned conductive polymer layer 18.

Figure 7:
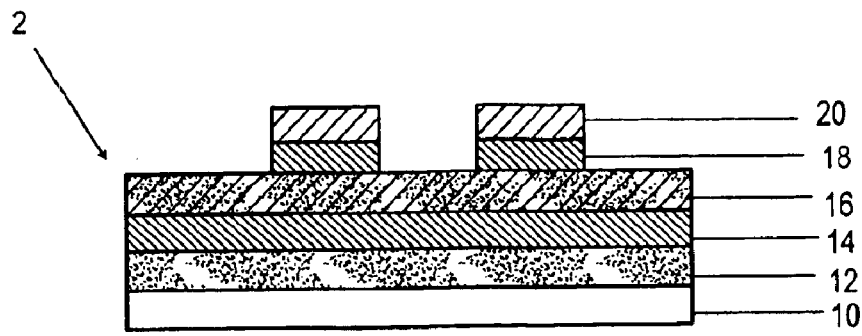
FIG. 7 is a side view of the substrate of FIG. 6 after having undergone an electroless plating process to deposit a second conductive layer on top of the conductive polymer pattern layer.

FIG. 7 is a side view of the substrate 2 of FIG. 6 after having undergone an electroless plating process to deposit a conductive layer 20 on top of the patterned conductive polymer layer 18. The conductive polymer layer 18 is used as a seed layer to enable the plating operation. The plating process is optimized to minimize plating on the vertical sidewalls of the conductive polymer layer 18.

It is readily apparent that the conductive layer 20 is not exposed to resist removal chemicals, preventing the possibility of damage to the conductive layer 20 due to chemical reactivity.

Figure 8:
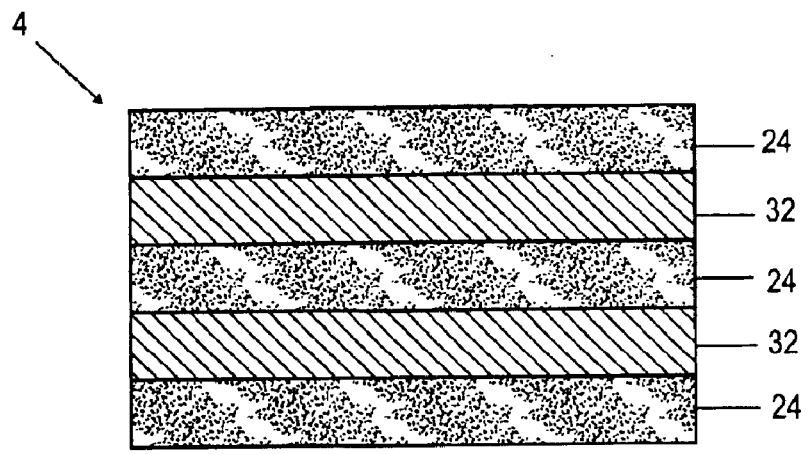
FIG. 8 is a top view of a substrate prior to undergoing a process of adding conductive traces to the substrate with a layer of ferroelectric polymer, in accordance with an embodiment of the present invention.

FIG. 8 is a top view of a substrate 4 prior to undergoing a process of adding a conductive layer to form conductive traces to the substrate 4 with a ferroelectric polymer layer, in accordance with an embodiment of the present invention. Metal layers 32 are formed on silicon oxide layers 24. The metal and silicon oxide layers 32,24 were patterned using conventional lithography and etch processes.

Figure 9:
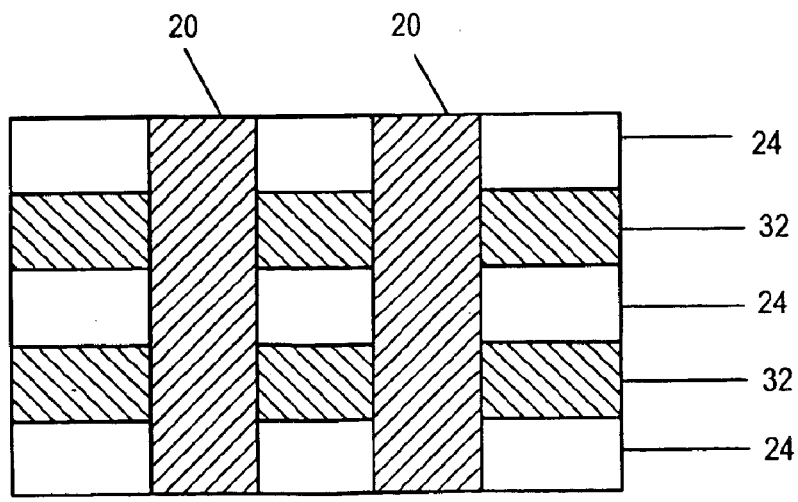
FIG. 9 is a top view of the substrate of FIG. 8 having undergone the process as provided in FIGS. 3–7.

FIG. 9 is a top view of the substrate 4 of FIG. 8 having undergone the process as provided in FIGS. 3–7. A conductive polymer and ferroelectric polymer layer (not shown) separate the first conductor 32 and second conductor layer 20 at the intersection of each.

Figure 10:
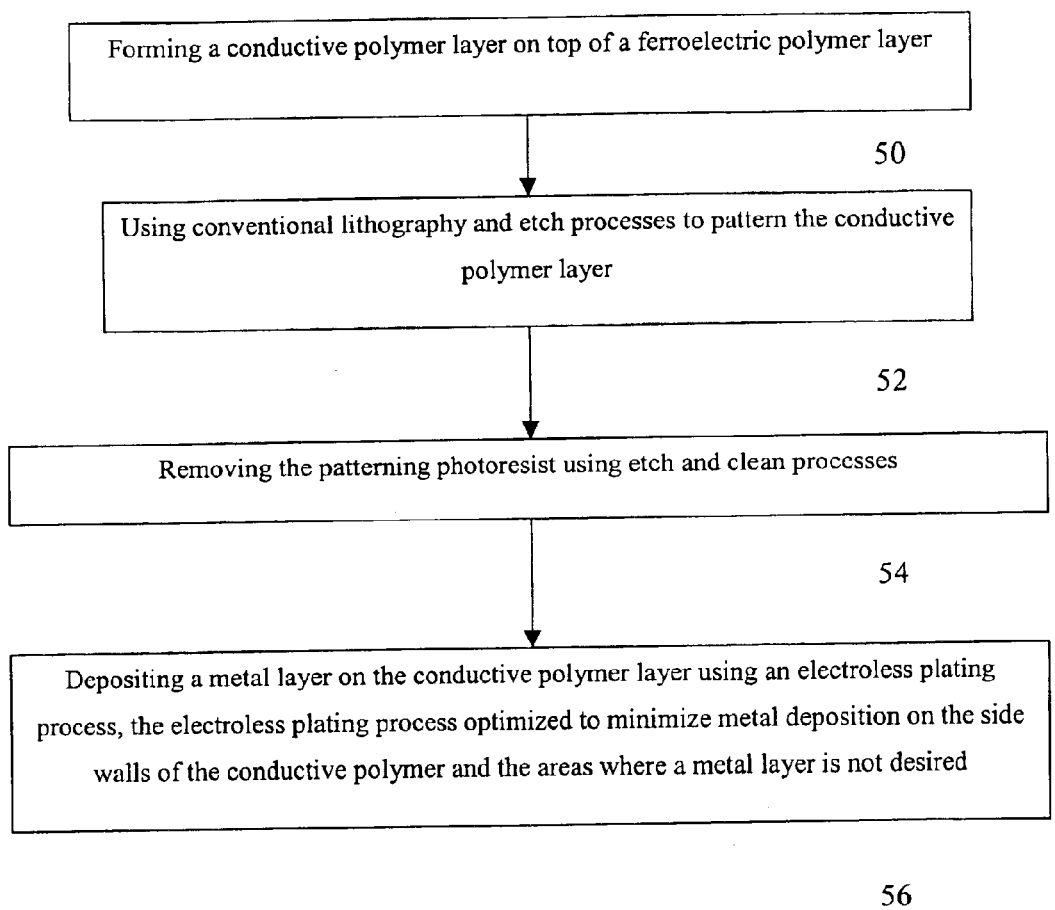
FIG. 10 is a flow diagram of the method of adding conductive traces to a substrate having a layer of ferroelectric polymer, in accordance with embodiments of the present invention.

FIG. 10 is a flow diagram of the method in accordance with embodiments of the present invention. The method comprises: forming a conductive polymer layer on top of a ferroelectric polymer layer 50; using conventional lithography and etch processes to pattern the conductive polymer layer 52; removing the patterning photoresist using etch and clean processes 54; and depositing a metal layer on the conductive polymer layer using an electroless plating process, the electroless plating process optimized to minimize metal deposition on the side walls of the conductive polymer and the areas where a metal layer is not desired 56.

Embodiments in accordance with the present invention eliminate the need for a subtractive metal patterning process to pattern a conductive layer above a ferroelectric polymer. Instead, a selective electroless deposition process is used. A conductive polymer is used as a seed layer for the electroless plating of the metal layer. A cost saving is provided by eliminating the chemical costs associated with conventional resist removal processing. The methods also potentially eliminate the requirement for aggressive and environmentally unsafe chemical-based photoresist removal processes.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for forming a conductive layer on a ferroelectric polymer layer, comprising:

forming a conductive polymer layer on the ferroelectric polymer layer;

using conventional lithography and etch processes to pattern the conductive polymer;

removing the patterning photoresist using etch and clean processes; and depositing a conductive layer on the conductive polymer layer using an electroless plating process.

2. The method of claim 1, wherein forming a conductive polymer layer on the ferroelectric polymer layer comprises:

forming a conductive polymer layer on the ferroelectric polymer layer using a spin deposition and cure process.

3. The method of claim 1, wherein using conventional lithography and etch processes to pattern the conductive polymer comprises:

using photoresist spin deposition to form the layer of photoresist on the conductive polymer layer, and exposing predetermined areas of the photoresist to a curing process.

4. The method of claim 1, wherein using conventional lithography and etch processes to pattern the conductive polymer comprises:

using conventional lithography and plasma etch processes to pattern the conductive polymer.

5. The method of claim 1, wherein depositing a conductive layer on the conductive polymer layer using an electroless plating process comprises:

depositing a conductive layer on the conductive polymer layer using an electroless plating process, optimizing the deposition process to minimize conductive layer deposition on the sidewalls of the conductive polymer.

6. A method for making a semiconductor substrate comprising:

providing a substrate including a silicon layer, a silicon dioxide layer, a conductive layer and a ferroelectric polymer layer;

forming a conductive polymer layer on the ferroelectric polymer layer;

using conventional lithography and etch processes to pattern the conductive polymer;

removing the patterning photoresist using etch and clean processes; and depositing a conductive layer on the conductive polymer layer using an electroless plating process.

7. The method of claim 6, wherein forming a conductive polymer layer on the ferroelectric polymer layer comprises:

forming a conductive polymer layer on the ferroelectric polymer layer using a spin deposition and cure process.

8. The method of claim 6, wherein using conventional lithography and etch processes to pattern the conductive polymer comprises:

using photoresist spin deposition to form the layer of photoresist on the conductive polymer layer, and exposing predetermined areas of the photoresist to a curing process.

9. The method of claim 6, wherein using conventional lithography and etch processes to pattern the conductive polymer comprises:

using conventional lithography and plasma etch processes to pattern the conductive polymer.

10. The method of claim 6, wherein depositing a conductive layer on the conductive polymer layer using an electroless plating process comprises:

depositing a conductive layer on the conductive polymer layer using an electroless plating process, optimizing the deposition process to minimize conductive layer deposition on the sidewalls of the conductive polymer.

* * * * *